United States Patent [19]

Kwon

[11] Patent Number: 4,971,834

[45] Date of Patent: Nov. 20, 1990

[54] PROCESS FOR PREPARING PRECURSOR FOR SILICON CARBIDE WHISKERS

[75] Inventor: Taehyun Kwon, Ithaca, N.Y.

[73] Assignee: Therm Incorporated, Ithaca, N.Y.

[21] Appl. No.: 372,908

[22] Filed: Jun. 29, 1989

[51] Int. Cl.$^5$ .............................................. B05D 7/00
[52] U.S. Cl. ................................... 427/214; 427/215; 427/397.7; 427/443.2
[58] Field of Search ................... 427/215, 397.7, 443.2

[56] References Cited

U.S. PATENT DOCUMENTS

| | | | |
|---|---|---|---|
| 1,451,399 | 4/1923 | Low | 423/336 |
| 3,085,863 | 4/1963 | Prener | 423/345 |
| 3,161,473 | 12/1964 | Pultz | 423/345 |
| 3,269,802 | 8/1966 | Wainer et al. | 264/29.2 |
| 3,403,008 | 9/1968 | Hamling | 423/251 |
| 3,433,725 | 3/1969 | Hough et al. | 204/164 |
| 3,721,732 | 3/1973 | Knippenberg et al. | 423/346 |
| 3,933,984 | 1/1976 | Kimura et al. | 423/345 |
| 4,410,502 | 10/1983 | Yamaguchi et al. | 423/345 |
| 4,432,957 | 2/1984 | Gupta et al. | 423/345 |
| 4,500,504 | 2/1985 | Yamamoto | 423/345 |
| 4,690,119 | 9/1987 | Kida et al. | 423/345 |

FOREIGN PATENT DOCUMENTS

| | | |
|---|---|---|
| 754352 | 10/1970 | Belgium . |
| 1565919 | 5/1969 | France . |
| 49-9500 | 1/1974 | Japan . |
| 57-123813 | 8/1982 | Japan . |
| 58-45195 | 3/1983 | Japan . |
| 58-45196 | 3/1983 | Japan . |
| 60-141698 | 7/1985 | Japan . |
| 60-239316 | 11/1985 | Japan . |
| 60-260497 | 12/1985 | Japan . |
| 61-17499 | 1/1986 | Japan . |
| 62-3098 | 1/1987 | Japan . |
| 62-3100 | 1/1987 | Japan . |
| 63-159300 | 7/1988 | Japan . |
| 508475 | 6/1976 | U.S.S.R. . |
| 1111925 | 5/1968 | United Kingdom . |
| 2116533 | 9/1983 | United Kingdom . |

OTHER PUBLICATIONS

Kendall, J. T. et al., "The Preparation of Pure Silicon Carbide," International Congress of Pure and Applied Chemistry, 11th, London, 1947, pp. 171–175.

*Primary Examiner*—Bernard Pianalto

[57] ABSTRACT

Precursor suitable for conversion into silicon carbide product containing a substantial amount of silicon carbide whiskers is preferably prepared by impregnating activated carbon particles (through 100 mesh) with silicon tetrachloride dissolved in methylene chloride, then impregnating the particles with aqueous solution of transition metal salt, preferably $Ni(NO_3)_2 \cdot 6H_2O$, reacting at room temperature to give carbon, hydrated silica, $Ni^{+30}$ and HCl, reacting with NaOH to convert HCl to NaCl and water and drying to remove methylene chloride and water. Molar ratios of carbon to silicon tetrachloride range from 5:1 to 10:1, of transition metal salt to silicon tetrachloride range from 1:50 to 1:200, of water to silicon tetrachloride range from 0.25:1 to 2:1, and of NaOH to silicon tetrachloride range from 0.8:1 to 2.0:1.

8 Claims, No Drawings

PROCESS FOR PREPARING PRECURSOR FOR SILICON CARBIDE WHISKERS

TECHNICAL FIELD

This invention is directed to preparing precursor useful for preparing silicon carbide whiskers useful, for example, for reinforcing plastics and metals and for the preparation of ceramic-ceramic composites.

BACKGROUND OF THE INVENTION

Yamamoto U.S. Pat. No. 4,500,504 and Kida U.S. Pat. No. 4,690,811 discloses heating a composition containing carbon powder, a source of $SiO_2$ in powder form, an iron, nickel or cobalt catalyst and NaCl spacer to obtain silicon carbide whiskers. Yamamoto teaches homogeneous introduction of catalyst by utilizing silica gel as the source of $SiO_2$ and immersing fine particles of it in aqueous solution of catalyst. Both patents rely on blending carbon particles and silicon source particles and sodium chloride is admixed or placed beneath the other raw materials. These procedures rely on solids/solids mixing which is difficult where large amounts are involved and do not maximize homogeneity.

Yamaguchi et al U.S. Pat. No. 4,410,502 discloses contacting carbon particles with a solution or sol of silicic acid to obtain homogeneity to obtain submicron sized particles rather than whiskers. This process has not been able to be adapted to whisker production.

Consideration has been given to use of silicon tetrachloride as a silicon source. It has heretofore been considered necessary to use silicon tetrachloride in a gas phase in the production of silicon carbide whiskers (See Pultz U.S. Pat. No. 3,161,473: Hough et al U.S. Pat. No. 3,433,725; Knippenberg et al U.S. Pat. No. 3,721,782; Japanese 49-9500; U.K. Patent Specification 1,111,925 and Kendall, J.T., et al, "The preparation of Pure Silicon Carbide," International Congress of Pure & Applied Chemistry, 11th, London, 1947, pp. 171–175).

SUMMARY OF THE INVENTION

It has been discovered herein that by employing a solution of silicon tetrachloride in organic liquid as the silicon source, impregnating this and aqueous catalyst solution into porous activated carbon powder and reacting to provide activated carbon particles impregnated with hydrated silica, catalyst and HCl, reacting with NaOH to neutralize HCl and form NaCl spacer and drying to remove solvent and water. An SiC precursor containing activated carbon particles, silica, catalyst and NaCl spacer is formed wherein all the components are homogeneously distributed. In such process the activated carbon particle size and activated carbon to silicon molar ratios have been found critical to the production of whiskers rather than fine particles.

In particular, the process herein comprises the steps of:

(a) impregnating carbon particles of size of through 100 mesh with a solution of silicon tetrachloride in organic solvent, (b) impregnating the product of step (a) with solution of a transition metal salt in water, and reacting to obtain activated carbon particles impregnated with substances comprising hydrated silica, transition metal ion and HCl, (c) adding aqueous NaOH to convert HCl to NaCl, (d) drying to substantially remove organic solvent and water, the molar ratio of activated carbon to silicon tetrachloride in step (a) ranging from 5:1 to 10:1, the molar ratio of transition metal salt in step (b) to silicon tetrachloride in step (a) ranging from 1:50 to 1:200, the molar ratio of water in step (b) to silicon tetrachloride in step (a) ranging from 0.25:1 to 2.0:1 (in determining this molar ratio any water of hydration in the transition metal salt can be ignored since so little is present), and the molar ratio of NaOH in step (c) to silicon tetrachloride in step (a) ranging from 0.8:1 to 2:1, thereby to obtain precursor convertible on heating in a non-reactive atmosphere to silicon carbide particle composition containing at least 20% by weight silicon carbide whiskers (silicon carbide basis).

On conversion to silicon carbide particles, the particles that are not whiskers are predominantly submicron sized silicon carbide particles. The whiskers and submicron sized particles are readily separated by processes known in the art, e.g., liquid-liquid floatation. The submicron sized particles have utility as abrasives or can be compacted into shapes.

The term "whisker" is used herein to mean silicon carbide particles having diameters ranging from 0.3 microns to 2 microns, lengths ranging from 3 microns to 30 microns, and aspect ratios (length to diameter ratios) ranging from 10 to 100.

DETAILED DESCRIPTION OF THE INVENTION

We turn now to step (a) in more detail.

The activated carbon particles preferably have a particle size of through 200 mesh, very preferably of through 100 mesh. The organic solvent is one that dissolves liquid silicon tetrachloride and is non-reactive with activated carbon and the transition metal salt. It can be, for example, chloroform, benzene, petroleum ether or diethyl ether. Preferably, it is methylene chloride. Since it is substantially removed in step (d), it does not participate in the stoichiometry of silicon carbide formation. The organic solvent is used in amount such to foster substantially uniform impregnation of all the silicon tetrachloride in step (a). Use of more solvent than is necessary causes a solvent removal burden in step (d). Normally, the volume ratio of solvent to silicon tetrachloride (liquid) ranges from 1:1 to 3:1.

Turning now to step (b), the transition metal salt is introduced as a catalyst for the conversion of the precursor product herein to silicon carbide, i.e., for reaction of carbon and silica to form silicon carbide. Any water soluble transition metal salt conventionally used to foster said reaction is suitable. These include, for example, nickel (II) salts, iron (II) salts, iron (III) salts, cobalt (II) salts and copper (II) salts $Ni(NO_3)_2 \cdot 6H_2O$ is preferred. Other suitable salts include, for example, $NiCl_2 \cdot 6H_2O$, $FeCl_3 \cdot 6H_2O$, $CoCl_2 \cdot 6H_2O$, and $CuCl_2 \cdot 2H_2$.

Preferably, the molar ratio of activated carbon to silicon tetrachloride in step (a) ranges from 5.5:1 to 7.5:1 very preferably from 6.0:1 to 7.0:1, the molar ratio of transition metal salt in step (b) to silicon tetrachloride in step (a) ranges from 1:75 to 1:150 and the molar ratio of water in step (b) to silicon tetrachloride in step (a) ranges from 0.5:1 to 1.0:1.

The reaction in step (b) is between silicon tetrachloride from step (a) and Water from the solution of transition metal salt and results in formation of hydrated silica and HCl. Said reaction can be carried out, for example, at temperatures ranging from 20° to 40° C. over a time period ranging from 30 minutes to 3 hours. The reaction is readily carried out at room temperature over a time period of 30 minutes to 1 hour. Cooling with ice water, e.g., at 2° C., is used to control the temperature.

Turning now to step (c), the molar ratio of NaOH to silicon tetrachloride impregnated in step (a) preferably ranges from 0.9:1 to 1.0:1. Sufficient water is present in the aqueous NaOH to complete hydrolysis of the $SiCl_4$ and so that the NaOH is readily impregnated uniformly into the activated carbon particles to reach HCl formed in the reaction of step (b) and form NaCl. The reaction of the NaOH with the HOI is readily carried out without addition of heat and forms NaCl and water substantially homogeneously distributed in the carbon particles. By-product water is removed in step (d).

The drying of step (d) is readily carried out for, example, at 100° C. to 150° C. for 2 to 5 hours in an oven.

The resulting precursor is converted to silicon carbide composition containing at least 20% silicon carbide whiskers by heating in a non-reactive atmosphere, such as argon, at a temperature over the boiling point of NaCl to about 1700° C., preferably 145020 C., for 1 to 4 hours, preferably 2 hours, to cause the carbon and silica to react to form silicon carbide. Succeeding purification steps include heating in air or oxygen, preferably air, for 2 to 6 hours at 500° to 900° C., preferably at 700° C. for 4 hours, to burn off unreacted carbon, washing with $HF/HNO_3$ to dissolve unreacted silica, NaCl and transition metal salt, washing with water to remove dissolved impurities and drying, for example, at a temperature up to 1OO° C., e.g., at room temperature for 1 hour.

The resulting product consists of substantially pure silicon carbide particles made up typically of 20 to 30% by weight whiskers and 70 to 80% by weight submicron sized particles.

The whiskers are readily isolated, e.g., by floatation utilizing surfactant as a floatation aid or organic and aqueous phases. The separating step is preferably carried out after heating to convert silica and carbon precursor to silicon carbide and prior to oxidizing excess carbon.

The following specific example illustrates the best mode of the invention.

EXAMPLE

A solution of $SiCl_4$ in methylene chloride was prepared by adding 15 ml (0.2 mole) $SiCl_4$ into 23 ml of methylene chloride. An aqueous solution of nickel catalyst was prepared by dissolving 0.5 g (1.72 mmole) $Ni(NO_3)_2 \cdot 6H_2O$ in 2 ml of water. Activated carbon particles (through 100 mesh), 15.4 g (1.28 mol), were impregnated by adding thereto the silicon tetrachloride solution, and then the aqueous nickel salt solution. Reaction to form hydrated silica and HCl homogeneously distributed along with nickel salt in the activated carbon was carried out by allowing the impregnated carbon particles to stand at room temperature for 30 minutes. The resulting product was black in color and was a gel containing activated carbon particles. Then an aqueous solution of NaOH (7.2 g, 0.18 moles) in 1 ml of water was intermixed whereby some of the HCl was neutralized and NaCl was formed. To ensure complete hydrolysis, another 10 ml of $H_2O$ was added to the gel. Reaction occurred substantially instantaneously. Drying was carried out by heating in an oven at 100° C. for 1 hour thereby to form precursor product which was a black solid. The precursor product was converted to silicon carbide containing composition by positioning said product in a graphite crucible in a box furnace and heating in an argon atmosphere at 1450° C. for two hours. The formed composition was then heated in air at 700° C. for 4 hours to burn off excess carbon. Then, stirring with $HF/HNO_3$(15 ml HF and 15ml $HNO_3$) was carried out; this dissolved NaCl, nickel catalyst and unreacted silica. Washing with water (3 times with 20 ml $H_2O$ each time) removed residual water soluble impurities. Drying was then carried out in an oven at 100° C. The resulting product was substantially pure silicon carbide product containing about 30% by weight substantially straight whiskers (with diameters ranging from 0.3 microns to 0.5 microns and lengths ranging from 3 microns to 30 microns); most of the remainder of the product consisted of submicron sized particles of silicon carbide.

COMPARATIVE EXAMPLE I

Example I was carried out except that the molar ratio of carbon to silicon tetrachloride was 3.4:1. The result was bent (unuseful) whiskers.

COMPARATIVE EXAMPLE II

Example I was carried out except that a granular powder of activated carbon (particle size of 6 to 10 mesh) was used. The result was silicon carbide particles (not whiskers) having a maximum dimension on the order of one micron.

COMPARATIVE EXAMPLE III

Where an equimolar amount of silicic acid was substituted for the silicon tetrachloride in Example I, submicron sized particles were obtained.

Variations will be evident to those skilled in the art. Therefore, the scope of the invention is intended to be defined by the claims.

What is claimed is:

1. A process for preparing precursor useful for preparing silicon carbide whiskers, said process comprising the steps of
   (a) impregnating activated carbon particles of size of through 100 mesh with a solution of silicon tetrachloride in organic solvent,
   (b) impregnating with a solution of transition metal salt in water, and reacting to obtain activated carbon particles impregnated with substances comprising hydrated silica, transition metal ion and HCl,
   (c) adding aqueous NaOH to convert HCl to NaCl,
   (d) drying to substantially remove organic solvent and water,
   the molar ratio of activated carbon to silicon tetrachloride in step (a) ranging from 5:1 to 10:1, the molar ratio of transition metal salt in step (b) to silicon tetrachloride in step (a) ranging from 1:50 to 1:200, the molar ratio of water in step (b) to silicon tetrachloride in step (a) ranging from 0.25:1 to 2:1, the molar ratio of NaOH in step (c) to silicon tetrachloride in step (a) ranging from 0.8:1 to 2.0:1,
   thereby to obtain precursor convertible on heating in a non-reactive atmosphere to silicon carbide particle composition containing at least 20% by weight, on a silicon carbide basis, of silicon carbide whiskers.

2. The process of claim 1 wherein said activated carbon to silicon tetrachloride molar ratio ranges from 5.5:1 to 7.5:1.

3. The process of claim 2 wherein said activated carbon to silicon tetrachloride molar ratio ranges from 6.0:1 to 7.0:1.

4. The process of claim 3 wherein the transition metal salt is $Ni(NO_3)_2 \cdot 6H_2O$.

5. The process of claim 4 wherein said molar ratio of nickel salt to silicon tetrachloride ranges from 1.75 to 1:150.

6. The process of claim 3 wherein said molar ratio of water to silicon tetrachloride ranges from 0.5:1 to 1.0:1.

7. The process of claim 3 where in said NaOH to silicon tetrachloride molar ratio ranges from 0.9:1 to 1.0:1.

8. The process of claim 3 wherein said organic solvent is methylene chloride.

* * * * *